United States Patent [19]

Diadiuk et al.

[11] Patent Number: 4,746,620
[45] Date of Patent: May 24, 1988

[54] LATERAL P-I-N PHOTODETECTOR

[75] Inventors: Vicky Diadiuk, Bedford; Steven H. Groves, Lexington, both of Mass.

[73] Assignee: Massachusetts Institute of Technology, Cambridge, Mass.

[21] Appl. No.: 888,950

[22] Filed: Jul. 23, 1986

Related U.S. Application Data

[63] Continuation of Ser. No. 689,873, Jan. 9, 1985, abandoned.

[51] Int. Cl.[4] .................. H01L 21/225; H01L 21/285
[52] U.S. Cl. ........................................ 437/3; 437/133; 437/160
[58] Field of Search .................... 29/572, 591; 148/1.5, 148/177, 178, 179, 188; 357/50; 437/3, 133, 160

[56] References Cited

U.S. PATENT DOCUMENTS 3,549,960 12/1970 Wedlock .............................. 317/234
4,376,285 3/1983 Leonberger et al. .................. 357/17
4,490,709 12/1984 Hammond et al. .................... 357/61

OTHER PUBLICATIONS

Ghandi, *VLSI Fabrication Principles Silicon and Gallium Arsenide*, John Wiley, New York, 1983.
Matsushima, "Zn-Diffused $In_{0.53}Ga_{0.47}As/InP$ Avalanche Photodetector", Appl. Phys. Lett. 36(6), 9/79.
Forrest et al., "Low Dark-Current, High-Efficiency Planar $In_{0.53}Ga_{0.47}As/InP$ P-I-N Photodiodes", IEEE Electron Device Letters, EDL-2, (11), 11/81.

Primary Examiner—George T. Ozaki
Attorney, Agent, or Firm—Hamilton, Brook, Smith & Reynolds

[57] ABSTRACT

A lateral p-i-n photodetector and a method of forming a lateral p-i-n photodetector in which p- and n-type regions are formed on a semi-insulator or i-type body by allowing metal and p-dopant compounds and metal and n-dopant compounds onto the i-type body. During alloying, p- and n-type regions are formed in the i-type body by diffusion of the dopants from the compounds, leaving the metallic compounds as n- and p-type contacts over respective p- and n-regions. In preferred embodiments, the i-material is either Fe doped InP or InGaAs.

8 Claims, 1 Drawing Sheet

LATERAL P-I-N PHOTODETECTOR

GOVERNMENT SUPPORT

This invention was developed under Department of the Air Force Contract No. F19628-85-C-0002.

This application is a continuation of application Ser. No. 689,873, filed 1-9-85, now abandoned.

TECHNICAL FIELD

This invention relates, in general, to light responsive transducers for converting optical energy to electrical energy and, more particularly, to p-i-n photodiodes for detection of optical signals.

BACKGROUND ART

The p-i-n photodiode has been found extremely useful as an optical to electrical energy transducer. The p-i-n photodiode generally consists of a layer of p-type conductivity material formed over a layer of intrinsic, or i-type material, formed over a layer of n-type conductivity material. In operation, radiation to be detected is absorbed in the i-layer where it generates electron-hole pairs. These pairs are separated by an electric biasing field resulting in current flow to an external circuit as carriers drift across the intrinsic region to the p and n regions and are collected by metallic contacts.

A planar or lateral form of p-i-n photodiode is described in U.S. Pat. No. 4,282,541. In this device, a pair of spaced apart, elongaged p- and n-type mesas are formed on an intrinsic or semi-insulating single crystal body by molecular beam epitaxial growth. In the planar p-i-n photodiode, the i-region between the p and n mesas is directly exposed to incident radiation, thus enabling efficiently photogeneration of electron-hole pairs, which are then able to drift and/or diffuse to the p- and n-type mesas.

Planar p-i-n photodiodes are generally formed by conventional semiconductor processes, such as molecular beam epitaxy (MBE) or diffusion or ion-implantation processes, each of which has distinct disadvantages. MBE requires ultra-high vacuum equipment, and diffusion and ion-implantation involve relatively high temperature processes. Additionally, each of these processes require a separate step of forming a contact on the p- and n-type surfaces for collecting the photogenerated electrons. This step, again, usually requires subjecting the detector body to high temperatures with the resultant possibility of damaging the previously formed body.

Accordingly, a need exists for a simple, low cost process for forming p-i-n lateral photodetectors which does not require relatively high temperatures or high vacuum.

DISCLOSURE OF THE INVENTION

The invention comprises a lateral p-i-n photodetector and a method of forming a lateral p-i-n photodetector in which p- and n-type regions are formed on a semi-insulator or i-type body by alloying metal and p-dopant compounds and metal and n-dopant compounds onto the i-type body. During alloying, p- and n-type regions are formed in the i-type body by diffusion of the dopants from the compounds, leaving the metallic compounds as n- and p-type contacts over respective p- and n-regions.

In preferred embodiments, the i-material is either Fe doped InP, alone, or Fe doped InGaAs grown on Fe doped InP, depending on the wavelength of interest.

BEST MODE OF CARRYING OUT THE INVENTION

Figure 1:
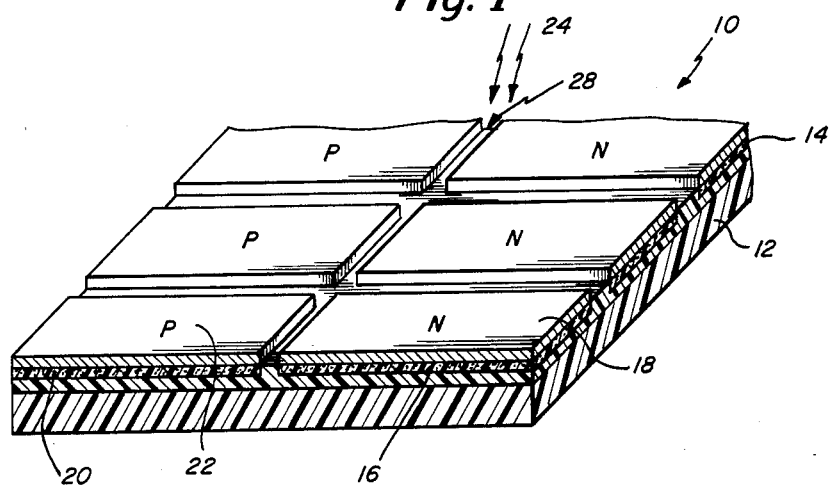
FIG. 1 is a schematic isometric view of a first illustrative embodiment of the invention.

With reference now to FIG. 1, there is shown a p-i-n photodiode or solar cell 10 comprising a semi-insulating single crystalline substrate 12 of Fe doped InP upon which an epitaxial layer 14 of 2-4 micrometers thickness of Fe doped InGaAs is formed by a conventional process, such as liquid phase epitaxy deposition. Fe doping of the InGaAs i-layer 14 and InP substrate 12 is required as a deep compensating impurity to decrease background carrier concentrations to the intrinsic level. For InP this level is $4 \times 10^6$ carriers/cm$^3$ and for InGaAs the level is $1 \times 10^{12}$ carriers/cm$^3$. This causes the resistance of the i-layer 14 and the substrate 12 to become relatively high, i.e., in the order of 3000 ohm-cm and $1 \times 10^7$ ohm-cm, respectively, and hence, the layer 14 and substrate 12 are considered to be semi-insulating.

A suitable mask is formed by conventional photolithography on the layer 14 to provide a pattern for evaporating thin strips (2,000–10,000 Angstroms thick) of contact metals, such as NiGeAu for the n-type regions and ZnAu for the p-type regions. The strips are separated by gaps 28 where the i-type layer 14 is exposed to optical radiation 24. The p-type regions 20 are formed by alloying the evaporated AuZn strips to form a metallic contact 22 over a p-type region 20 created by diffusion of the p-type dopant Zn from the contact compound of ZnAu during alloying. Similarly, the n-type regions 16 are formed by alloying the evaporated NiGeAu strips to form a metallic contact 18 over an n-type dopant Ge from the contact compound NiGeAu during alloying. A suitable temperature range for alloying these metal contact strips is a temperature of about 390° C. to 450° C. for about 5 to 30 seconds. This low temperature-time exposure is unlikely to damage the previously formed i-type body.

Figure 2:
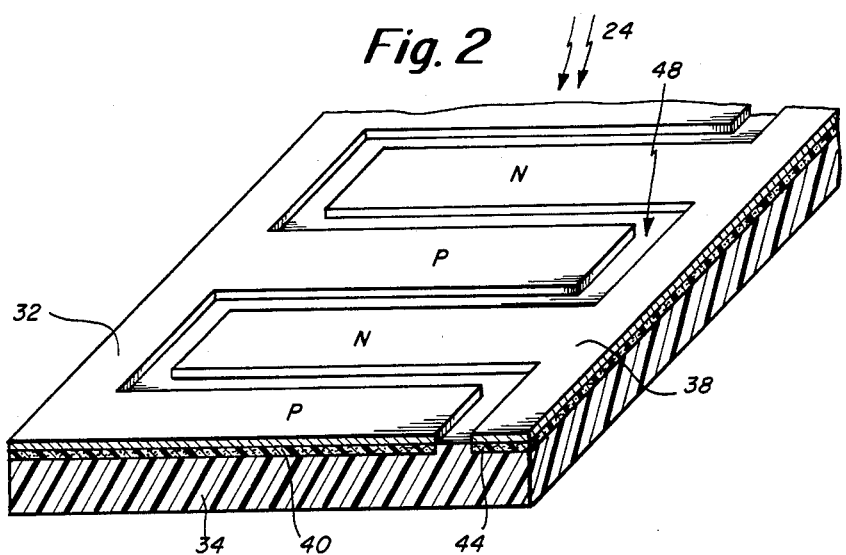
FIG. 2 is a schematic isometric view of a second embodiment of the invention.

FIG. 2 shows an alternate embodiment of the invention in which the p-and n-type regions 40 and 44, respectively, are formed as interdigitated structures with an elongate gap 48 exposing the semi-insulating substrate 34. Substrate 34 may, in this embodiment also, be formed of Fe doped InP grown by the liquid encapsulated Czochralski (LEC) technique. Note also that the InGaAs layer 14 of FIG. 1 is not utilized in this embodiment, but could be. Otherwise, the device of FIG. 2 is substantially identical to and formed as in FIG. 1 by evaporating metallic compounds of AuZn and NiGeAu to form respective p- and n-type contacts 32 and 38 ad heating the structure for a period of 5 to 30 seconds at a temperature of about 390°–450° C. to form respective p-type and n-type regions 40 and 44 underlying the contacts by diffusion of the p- and n-type dopants into the i-type body 34 during the heating process.

Lateral p-i-n photodetectors fabricated in accordance with this invention exhibit many desirable processing and performance characteristics. They are simply formed by alloying p and n-type-doped contact metals on semi-insulating InP or InGaAs. There is no need to form a junction by diffusion, ion implantation or specific layer growth, so the fabrication process is greatly simplified. This, in addition, to the planr geometry and the fact that they are formed on semi-insulating substrates, makes them ideal candidates for monolithic integration. For example, a Field Effect Transistor (FET) could be fabricated, with the detector being formed as part of the FET metallization steps, avoiding junction exposure to high temperature cycling during FET fabrication. In addition, because of their ease of fabrication, planar geometry and uniformity of characteristics throughout a wafer, these devices are potentially useful for photodetector arrays. In terms of performance, these devices exhibit high quantum efficiency and high speed at wavelengths in the 0.6 to 1.7 $\mu$m range. Photodiodes with relatively small gaps of 3 to 20 microns have been fabricated in accordance with the invention.

EQUIVALENTS

Other dopants and metals may be substituted for the ZnAu and NiGeAu compounds. For example, cadmium or magnesium may be substituted for the Zn and Pt, Ag could be used in place of Au and Sn, S in place of Ge. Also, the intrinsic body may comprise other suitably doped semiconductors, such as GaAs, AlAs, InSb, GaSb, and alloys of these semiconductors. Preferably, such semiconductors may comprise semi-insulating III–V compounds and their alloys. Other dopants, such as Co may be used to make the InP or InGaAs semi-insulating and InGaAsP may be substituted as a semiconductor material. Thus, although preferred embodiments of the invention has been described in detail, it is to be understood that various changes, substitutions and alterations can be made therein, without departing from the spirit and scope of the invention, as defined by the following claims.

What is claimed is:

1. A method of forming a light responsive rectifying photodetector comprising the steps of:
   a. forming a semi insulating body of InP by doping an InP body with a deep compensating dopant to achieve a carrier concentration at least equal to about the intrinsic level of $4 \times 10^6$ carriers/cm$^3$;
   b. evaporating on a major surface of said body, a first patterned thin strip of contact metal doped with p-type dopant and a second patterned thin strip of contact metal doped with n-type dopant, said patterns being separated by a relatively small gap exposing an active intrinsic region of said i-type body;
   c. subjecting said patterned body to a heat treatment in which the strips are heated causing the formation of low resistance p-type and n-type contact electrodes thereby concurrently forming a planar p-i-n rectifying function laterally along said major surface.

2. The method of claim 1 wherein the deep compensating impurity comprises Fe or Co and the first patterned strip is formed of AuZn and the second patterned strip of NiGeAu.

3. The method of claim 1 wherein a layer of Fe doped In$_{0.53}$Ga$_{0.47}$As having a carrier concentration of about $1 \times 10^{12}$ carriers/cm$^3$ is epitaxially formed on said InP body prior to step b and said patterned strips are formed on said layer.

4. The method of claim 1 in which the distance between the gap is 3 to 20 microns.

5. The method of claim 2 in which the heat treatment is at a temperature between about 390° C. to 450° C. for a period of between about 5–30 seconds.

6. A method of forming a light responsive p-i-n junction transducer comprising the steps of:
   a. forming a semi-insulating semiconductor body of III–V compounds by doping a III–V compound body with a deep compensating dopant to achieve a carrier concentration at least equal to about the intrinsic level of carriers/cm$^3$ for said body;
   b. depositing on a major surface of said body, a first patterned strip of contact metal doped with p-type dopant and a second patterned strip of contact metal doped with n-type dopant, said patterned strips being relatively thin in height and separated by a relatively small gap, exposing an active intrinsic region of said i-type body;
   c. subjecting said patterned body to a heat treatment in which the strips are sufficiently heated to cause the dopants to diffuse into said body to form respective shallow p-type and n-type regions under said strips leaving said strips to provide respective ohmic contact electrodes to said regions and concurrently forming a photodetector with a planar p-i-n rectifying junction laterally along the major surface of said III–V body.

7. The method of claims 1 or 6 in which the thin patterned strips are about 10,000 Å thick or less.

8. The method of claim 6 wherein the III–V compound is GaAs.

* * * * *

UNITED STATES PATENT AND TRADEMARK OFFICE
CERTIFICATE OF CORRECTION

PATENT NO. : 4,746,620
DATED : May 24, 1988
INVENTOR(S) : Vicky Diadiuk and Steven H. Groves It is certified that error appears in the above—identified patent and that said Letters Patent is hereby corrected as shown below:

Claim 1, col. 4, line 7, "function" should be spelled ---junction---.

Signed and Sealed this

Eighteenth Day of October, 1988

Attest:

DONALD J. QUIGG

Attesting Officer      Commissioner of Patents and Trademarks